(12) United States Patent
Naito

(10) Patent No.: US 10,529,839 B2
(45) Date of Patent: Jan. 7, 2020

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/088,139

(22) Filed: Apr. 1, 2016

(65) Prior Publication Data

US 2016/0336435 A1 Nov. 17, 2016

(30) Foreign Application Priority Data

May 15, 2015 (JP) .................................. 2015-100348
Nov. 12, 2015 (JP) .................................. 2015-222328

(51) Int. Cl.
*H01L 29/739* (2006.01)
*H01L 29/74* (2006.01)
(Continued)

(52) U.S. Cl.
CPC ...... *H01L 29/7397* (2013.01); *H01L 27/0635* (2013.01); *H01L 29/1095* (2013.01)

(58) Field of Classification Search
CPC ............. H01L 29/0661; H01L 29/7397; H01L 27/0635; H01L 29/1095; H01L 29/66348;
(Continued)

(56) References Cited

U.S. PATENT DOCUMENTS 5,381,026 A * 1/1995 Shinohe ............ H01L 29/42308
257/147
5,801,420 A * 9/1998 Fujishima ........... H01L 29/0634
257/133
(Continued)

FOREIGN PATENT DOCUMENTS

JP     H10326897 A    12/1998
JP     2000-101076 A   4/2000
(Continued)

OTHER PUBLICATIONS

Office Action issued for counterpart Japanese Application No. 2015-222328, issued by the Japan Patent Office dated May 28, 2019(drafted on May 22, 2019).

*Primary Examiner* — Mary A Wilczewski
*Assistant Examiner* — Tsz K Chiu

(57) ABSTRACT

When formed to have a lattice pattern, trenches are deeper at the portions thereof corresponding to the vertices of the lattice pattern than at the portions thereof corresponding to the sides. Such variations in the depths of trenches may disadvantageously result in variations in the gate threshold voltages ($V_{th}$). A semiconductor device includes two first trenches extending in a first direction with a predetermined region being sandwiched therebetween, where the predetermined region is provided in a semiconductor substrate on a front surface side thereof, and a second trench provided in the predetermined region, the second trench being spatially spaced away from the first trenches and being shorter than any of the first trenches. Here, the first and second trenches each include a trench insulating film, and a trench electrode in contact with the trench insulating film.

22 Claims, 14 Drawing Sheets

(51) Int. Cl.
*H01L 29/10* (2006.01)
*H01L 27/06* (2006.01)

(58) Field of Classification Search
CPC .......... H01L 29/7428; H01L 29/66121; H01L 29/66136; H01L 2924/12036; H01L 29/73; H01L 29/735; H01L 29/7394; H01L 29/7395; H01L 29/7801; H01L 29/7816; H01L 29/7825; H01L 29/66674; H01L 29/66325–66348; H01L 29/7393–7398; H01L 2924/13055; H01L 29/083–0834

See application file for complete search history.

(56) References Cited

U.S. PATENT DOCUMENTS

| | | | | |
|---|---|---|---|---|
| 6,114,727 A * | 9/2000 | Ogura | ................. | H01L 29/0696 257/212 |
| 6,153,896 A * | 11/2000 | Omura | ............. | H03K 17/08128 257/139 |
| 6,359,306 B1 * | 3/2002 | Ninomiya | ........... | H01L 29/7825 257/328 |
| 6,492,687 B2 * | 12/2002 | Imam | ................. | H01L 27/0705 257/365 |
| 6,710,403 B2 * | 3/2004 | Sapp | ................... | H01L 29/7813 257/228 |
| 6,818,945 B2 * | 11/2004 | Kawaguchi | ......... | H01L 29/7813 257/328 |
| 7,675,113 B2 * | 3/2010 | Sakamoto | ........... | H01L 29/0696 257/139 |
| 7,714,365 B2 * | 5/2010 | Werner | ............... | H01L 29/0623 257/263 |
| 7,800,183 B2 * | 9/2010 | Okuno | ................ | H01L 29/0696 257/370 |
| 8,878,476 B2 * | 11/2014 | Hirose | ..................... | B60L 3/00 180/271 |
| 9,287,354 B2 * | 3/2016 | Hirler | ............... | H01L 29/66712 |
| 2007/0114570 A1 * | 5/2007 | Yamaguchi | ......... | H01L 29/0696 257/197 |
| 2012/0217541 A1 * | 8/2012 | Hsieh | ................ | H01L 29/7397 257/140 |
| 2012/0286288 A1 | 11/2012 | Hussein et al. | | |
| 2012/0292662 A1 * | 11/2012 | Matsuura | ........... | H01L 29/66348 257/139 |
| 2014/0054645 A1 | 2/2014 | Saito et al. | | |
| 2014/0291757 A1 * | 10/2014 | Hirabayashi | ........ | H01L 29/7397 257/330 |
| 2015/0206960 A1 * | 7/2015 | Hirabayashi | ........ | H01L 27/0727 257/140 |
| 2016/0111529 A1 * | 4/2016 | Hirabayashi | ........ | H01L 29/7397 257/139 |

FOREIGN PATENT DOCUMENTS

| | | |
|---|---|---|
| JP | 2013-150000 A | 8/2013 |
| JP | 2015138789 A | 7/2015 |

* cited by examiner

SEMICONDUCTOR DEVICE

The contents of the following Japanese patent applications are incorporated herein by reference:
NO. 2015-100348 filed on May 15, 2015, and
NO. 2015-222328 filed on Nov. 12, 2015.

BACKGROUND

1. Technical Field

The present invention relates to a semiconductor device.

2. Related Art

In the conventional art, trench gates form a lattice pattern (see, for example, Japanese Patent Application Publication No. 2012-190938) in order to increase carrier injection enhanced effects (hereinafter, simply referred to as "the IE effects") for a drift layer. Furthermore, in the conventional art, a first gate interconnection and a second gate interconnection, which are formed as stripes, are arranged parallel to each other and supplied with independent control signals from each other (see, for example, Japanese Patent Application Publication No. 2000-101076). Furthermore, in the conventional art, a first element unit and a second element unit in a semiconductor device are controlled by different signals (see, for example, Japanese Patent Application Publication No. 2012-238715).

Generally speaking, a trench is formed by defining a trench formation region at the front surface of a semiconductor substrate using a mask made of silicon oxide or the like and subjecting the trench formation region to etching. In a case where the trench formation region has a lattice pattern, a vertex is defined between every two sides. Here, the regions corresponding to the vertices are etched away more deeply than the regions corresponding to the sides. Thus, the trenches are deeper at the vertices than at the sides. Such variations in the depths of trenches may disadvantageously result in variations in the gate threshold voltages ($V_{th}$).

SUMMARY

A first aspect of the innovations may include a semiconductor device including two first trenches extending in a first direction with a predetermined region being sandwiched therebetween, where the predetermined region is provided in a semiconductor substrate on a front surface side thereof, and a second trench provided in the predetermined region, the second trench being spatially spaced away from the first trenches and being shorter than any of the first trenches. Here, the first and second trenches each include a trench insulating film, and a trench electrode in contact with the trench insulating film.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
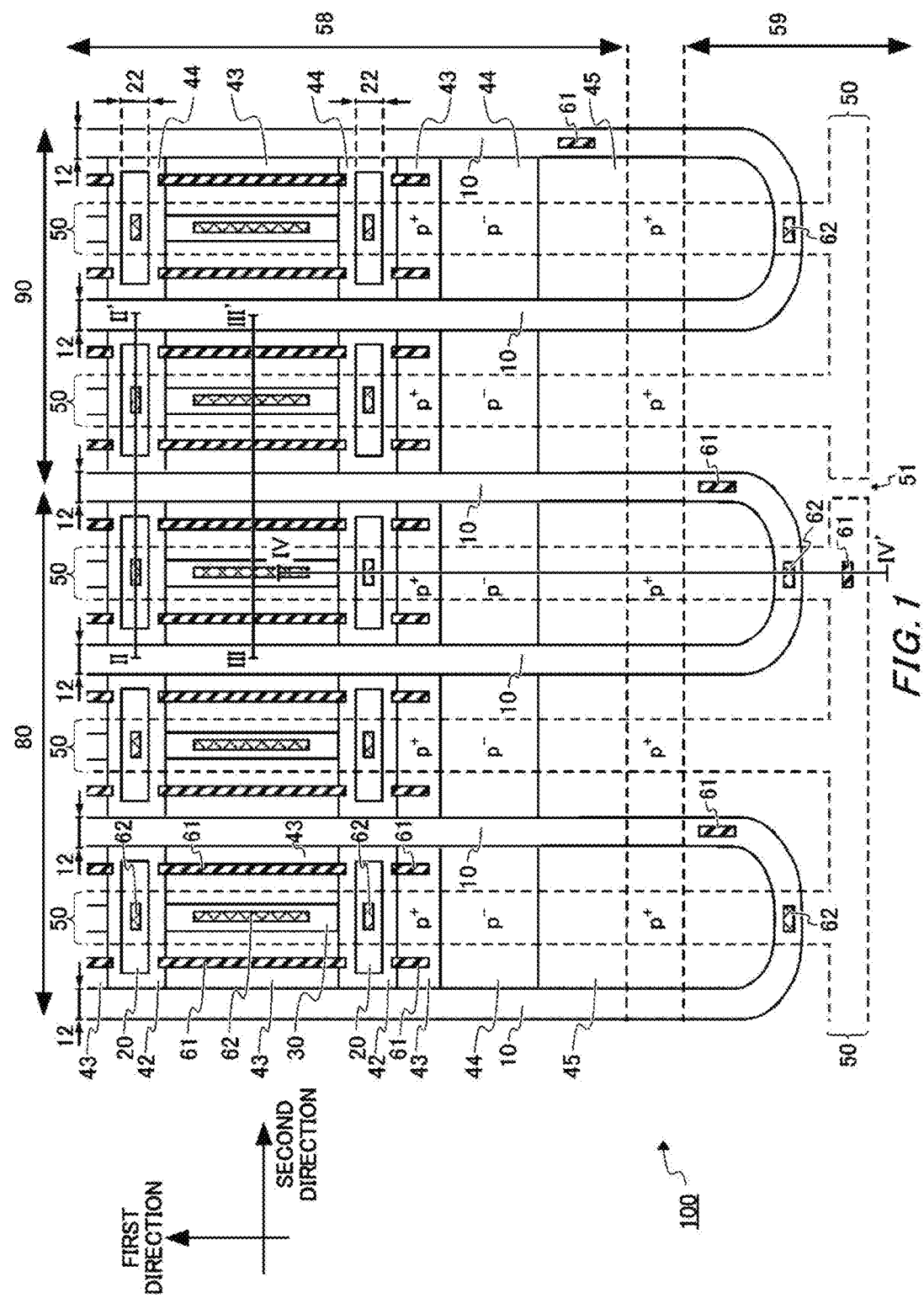
FIG. 1 is a schematic top view showing a semiconductor device 100 relating to a first embodiment.

FIG. 1 is a schematic top view showing a semiconductor device 100 relating to a first embodiment. The semiconductor device 100 is a vertical semiconductor device having electrodes formed on the front and back surfaces of a substrate. The semiconductor device 100 relating to the present exemplary embodiment includes an insulating film gate bipolar transistor (IGBT) region 80 including an IGBT and a diode region 90 including a free wheeling diode connected in antiparallel with the IGBT.

FIG. 1 only partially shows the IGBT region 80 and the diode region 90, which are in the active region of the semiconductor device 100, but the semiconductor device 100 may have a breakdown voltage structure surrounding the active region. The active region indicates a region through which currents flow when the semiconductor device 100 is turned on. The breakdown voltage structure reduces concentration of electrical fields in the semiconductor device 100 on the front surface side of the semiconductor substrate. The breakdown voltage structure includes, for example, guard rings, field plates, RESURFs (reduced surface fields) and combinations thereof.

The semiconductor device 100 includes a plurality of first trenches 10 extending in a first direction. The first trenches 10 are provided in the IGBT region 80 and the diode region 90. In FIG. 1, the first trenches 10 are part of U-shaped trenches. Note that, in the present specification, one longitudinal portion that is part of a U-shaped trench and extends in the first direction is referred to as "one first trench 10 extending in the first direction." In other words, each U-shaped trench includes two first trenches 10 extending in the first direction. The semiconductor device 100 relating to the present exemplary embodiment includes three or more first trenches 10 extending in the first direction that are adjacent to each other in a second direction that is perpendicular to the first direction. The curved portion of the U-shaped trench is used to form a contact with an interconnection layer 50 and a gate electrode 59.

Each pair of two first trenches 10 extending in the first direction sandwich a predetermined region therebetween. The predetermined region is provided in the semiconductor substrate on the front surface side thereof. In the present specification, the predetermined region is a region that is positioned in the semiconductor substrate on the front surface side thereof and includes one or more first-conductivity-type regions and one or more second-conductivity-type regions alternately arranged along the first direction. In the present exemplary embodiment, the predetermined region may be a region in the IGBT region 80 in which one or more first-conductivity-type emitter regions 42 and one or more second-conductivity-type contact regions 43 are repetitively arranged to be adjacent to each other in the first direction. Also, the predetermined region may be a region in the diode region 90 in which one or more second-conductivity-type base regions 44 and one or more second-conductivity-type contact regions 43 are repetitively arranged to be adjacent to each other in the first direction.

In the present exemplary embodiment, the first conductivity type indicates the n-type, and the second conductivity type indicates the p-type, but the first conductivity type may indicate the p-type and the second conductivity type may indicate the n-type. In the present exemplary embodiment, the first-conductivity-type emitter regions 42 are $n^+$-type emitter regions 42, the second-conductivity type contact regions 43 are $p^+$-type contact regions 43, and the second-conductivity-type base regions 44 are $p^-$-type base regions 44. Note that, as used herein, the expression "$n^+$-type" means a higher concentration of n-type impurities than the expression "n-type," and the expression "$n^-$-type" means a lower concentration of n-type impurities than the expression "n-type." Likewise, the expression "$p^+$-type" means a higher concentration of p-type impurities than the expression "p-type," and the expression "$p^-$-type" means a lower concentration of p-type impurities than the expression "p-type."

In the predetermined region in the IGBT region 80, the emitter regions 42 and the contact regions 43 are continuously and cyclically arranged in the first direction with the length ratio in the first direction being set to 1:3. For example, the length of the emitter region 42 in the first direction is 1 μm and the length of the contact region 43 in the first direction is 3 μm. Likewise, in the diode region 90, the base regions 44 and the contact regions 43 are continuously and cyclically arranged in the first direction with the length ratio in the first direction being set to 1:3. Note that, as shown in FIG. 1, the contact region 43 that is the closest to the curved portion of the U-shaped trench may exceptionally be shorter in the first direction than the other contact regions 43.

Second trenches 20 are provided in the IGBT region 80 and the diode region 90. Each second trench 20 is provided in the above-described predetermined region and spatially spaced away from the two first trenches 10 extending in the first direction. The second trench 20 is provided in at least one emitter region 42, which is the first-conductivity-type region. The second trenches 20 are formed in the predetermined regions, where each predetermined region is sandwiched between the first trenches 10 arranged in the second direction. In each predetermined region, a plurality of second trenches 20 are provided to be adjacent to each other in the first direction.

As used herein, the phrase "trenches are spatially spaced away" means that, when the trenches are formed by forming an etching mask of a predetermined pattern on the front surface of the semiconductor substrate and performing etching, the trenches are not spatially connected to each other. Accordingly, as long as the trenches are not connected to each other when formed by etching, the trenches are considered to be spatially spaced away from each other in the present specification whether or not the trenches have adjacent trench insulating films or share common trench insulating films.

Each second trench 20 is shorter than either of the two first trenches 10 extending in the first direction that sandwich the second trench 20 therebetween. In addition, the direction in which the second trenches 20 extend is not parallel to the first direction. In the present exemplary embodiment, the direction in which the second trenches 20 extend is the second direction perpendicular to the first direction. In the present exemplary embodiment, the width 12 of the first trenches 10 is the same as the width 22 of the second trenches 20.

In the present exemplary embodiment, when the first trenches 10 and the second trenches 20 are formed by etching, the open regions of the etching mask for the first trenches 10 do not intersect with and are separated away from the open regions of the etching mask for the second trenches 20. In this manner, the first trenches 10 and the second trenches 20 do not intersect with each other, which can allow uniform trench depths to be achieved. Accordingly, the present exemplary embodiment can avoid the variations in the parameters $V_{th}$. In addition, the present exemplary embodiment can increase the IE effects and can thus achieve a lowered on-voltage.

The semiconductor device 100 relating to the present exemplary embodiment includes third trenches 30 that are spatially spaced away from the first trenches 10 and the second trenches 20 and extend in a different direction from the second trenches 20. The third trenches 30 relating to the present exemplary embodiment extend parallel to the first direction.

At least a partial region of each third trench 30 is provided in the contact region 43, which is the second-conductivity-type region. In the present exemplary embodiment, the entire region of the third trench 30 is provided in the contact region 43. The third trench 30 relating to the present exemplary embodiment extends in the first direction. The third trench 30 is separated away in the first direction from the second trench 20 and in the second direction from the first trench 10. Since the third trench 30 is provided in the contact region 43, the present exemplary embodiment can make effective use of the contact region 43 and further increases the IE effects.

The semiconductor device 100 includes a plurality of electrode contacts 61, a plurality of interconnection layer contacts 62, an interconnection layer 50, and emitter and gate electrodes 58 and 59, which are referred to as an electrode layer. The electrode contacts 61 provide electrical contact between one of the emitter electrode 58 and the gate electrode 59 and the trench electrodes in the trenches. The interconnection layer contacts 62 provide electrical contact between the interconnection layer 50 and the trench electrodes in the trenches.

The emitter electrode 58 and the gate electrode 59 are electrically connected through the electrode contacts 61 to part of each predetermined region in the semiconductor substrate. In FIG. 1, the electrode contacts 61 are indicated by the shaded portions. In the present exemplary embodiment, the emitter electrode 58 is electrically connected through the electrode contacts 61 to the contact regions 43 adjacent to the base regions 44 and to the emitter regions 42 adjacent to these contact regions 43.

The emitter electrode 58 is electrically connected, to the emitter regions 42 and the contact regions 43 that are continuously and cyclically arranged to be adjacent to each other in the first direction, through the electrode contacts 61 provided in the emitter regions 42 and the contact regions 43. The emitter electrode 58 is electrically connected through the electrode contacts 61 to the trench electrodes in the first trenches 10 in the diode region 90. The gate electrode 59 is electrically connected through the electrode contacts 61 to the first trenches 10 in the IGBT region 80 and to the interconnection layer 50 in the IGBT region 80.

The interconnection layer 50 is provided in the IGBT region 80 and the diode region 90. The interconnection layer 50 is shaped like a comb between the emitter and gate electrodes 58 and 59 and the semiconductor substrate. The interconnection layer 50 may provide interconnections made of polysilicon. The interconnection layer 50 may provide interconnections made of one or more metals selected from among tungsten (W), copper (Cu) and/or gold (Au), and may be two- or three-layered. When made of metals, the interconnection layer 50 can have a more minute pattern than when made of polysilicon.

Here, the interconnection layer 50 in the IGBT region 80 is electrically disconnected from the interconnection layer 50 in the diode region 90 by a disconnecting portion 51 positioned at the boundary between the IGBT region 80 and the diode region 90. In the present exemplary embodiment, the interconnection layer 50 extends in the first direction and electrically connects, through the interconnection layer contacts 62, the trench electrodes in the first trenches 10 to the trench electrodes in the second and third trenches 20 and 30 in the predetermined regions. In FIG. 1, the interconnection layer contacts 62 are indicated by different hatchings than the electrode contacts 61.

The interconnection layer 50 in the IGBT region 80 also extend in the second direction and is electrically connected to the gate electrode 59 through the electrode contacts 61. Thus, in the IGBT region 80, each trench electrode has the same potential as the gate electrode 59.

The interconnection layer 50 in the diode region 90, on the other hand, extend in the second direction but is not electrically connected to the gate electrode 59. In the diode region 90, the trench electrodes in the first trenches 10 are electrically connected to the emitter electrode 58 through the electrode contacts 61. The respective trench electrodes in the diode region 90 are electrically connected to the emitter electrode 58 since the trench electrodes are electrically connected to each other through the interconnection layer 50. This can prevent interference which may occur between the IGBT region 80 and the diode region 90 when the trenches in the IGBT region 80 and the trenches in the diode region 90 are both electrically connected to the gate electrode 59.

In the present exemplary embodiment, the interconnection layer 50 is provided in the IGBT region 80 and the diode region 90. The present exemplary embodiment can achieve a more planar surface for the semiconductor substrate than when the interconnection layer 50 is not provided in the diode region 90. This can reduce the stress that may be generated within a packaged semiconductor device 100.

In FIG. 1, the reference numerals are not assigned to all of the components. It is, however, clearly seen from FIG. 1 that the second trenches 20, the third trenches 30, the emitter regions 42, the contact regions 43, the base regions 44, the well regions 45, the electrode contacts 61 and the interconnection layer contacts 62 are respectively configured in the same manner in the IGBT region 80 and in the diode region 90.

Figure 2:
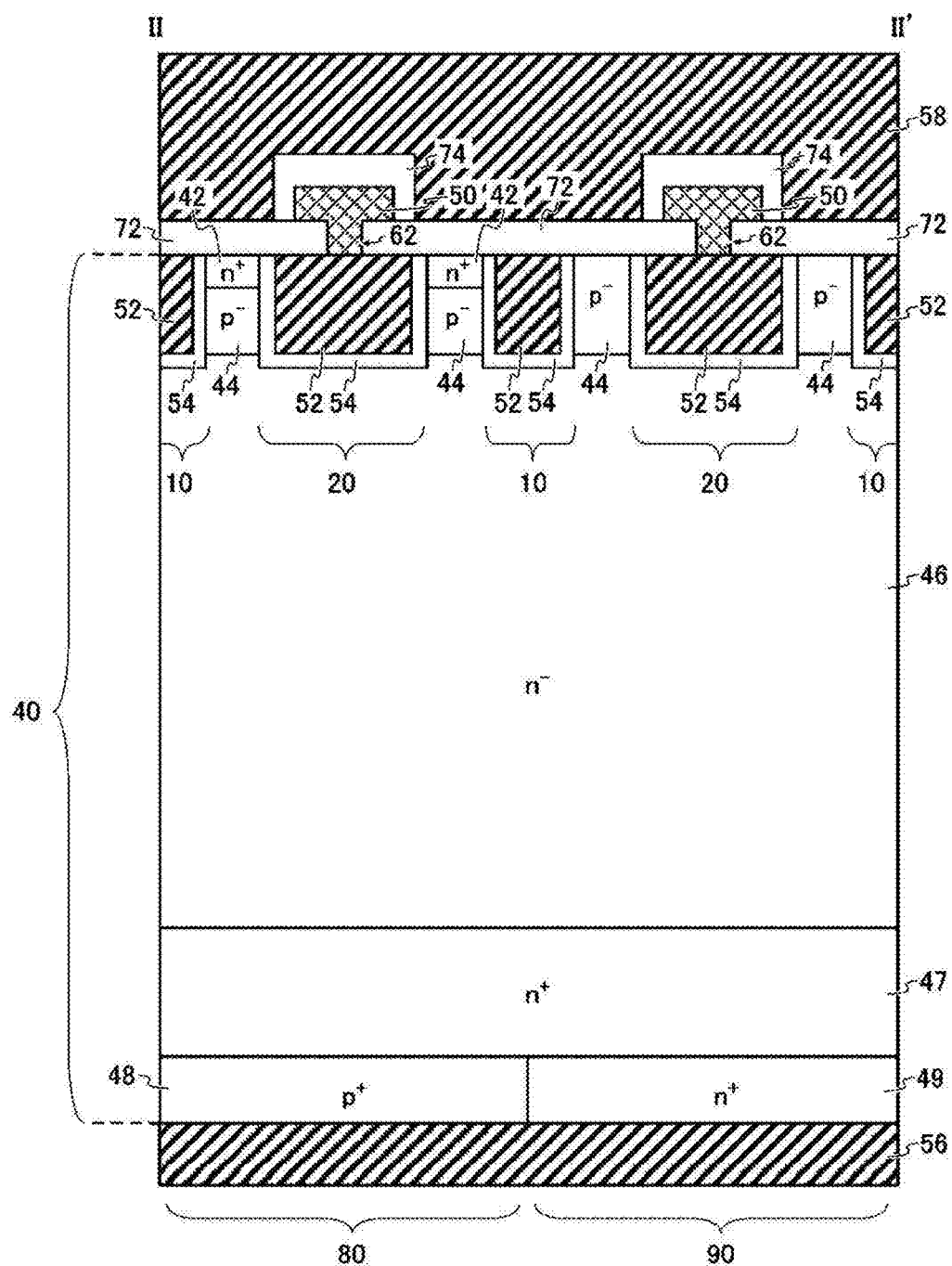
FIG. 2 is a cross-sectional view showing the semiconductor device 100 along II-II' in FIG. 1.

FIG. 2 is a cross-sectional view showing the semiconductor device 100 along II-II' in FIG. 1. The cross-section along II-II' is obtained by cutting in a direction parallel to the second direction the region that includes the first trenches 10 and the second trenches 20 and crosses the border between the IGBT region 80 and the diode region 90. The emitter electrode 58 is formed on the front surface of a semiconductor substrate 40. The emitter electrode 58 may be electrically connected to emitter terminals. The collector electrode 56 is formed on the back surface of the semiconductor substrate 40. The emitter electrode 58 and the collector electrode 56 are made of an electrically conductive material such as a metal. As used herein, one of the surfaces of a component such as a substrate, a layer, and a region which is closer to the emitter electrode 58 is referred to as the front surface of the component, and the other surface closer to the collector electrode 56 is referred to as the back surface or bottom of the component.

The semiconductor substrate 40 may be a silicon substrate, and a silicon carbide substrate, a nitride semiconductor substrate or the like. The base regions 44 of the second conductivity type are provided in the semiconductor substrate 40 on the front surface side thereof. In the present exemplary embodiment, the base regions 44 are of the p⁻-type. In addition, the emitter regions 42 of the first conductivity type are provided in the base regions 44 on the front surface side thereof in the IGBT region 80. Note that the emitter regions 42 of the first conductivity type are not provided in the base regions 44 on the front surface side thereof in the diode region 90. In the present exemplary embodiment, the emitter regions 42 are of the $n^+$-type.

The semiconductor substrate 40 includes a drift layer 46 of the first conductivity type, a buffer layer 47 of the first conductivity type, a collector layer 48 of the second conductivity type, and a cathode layer 49 of the first conductivity type. In the present exemplary embodiment, the drift layer 46 is of the $n^-$-type, the buffer layer 47 is of the $n^+$-type, the collector layer 48 is of the $p^+$-type, and the cathode layer 49 is of the $n^+$-type.

The drift layer 46 is provided on the back surfaces of the base regions 44. The buffer layer 47 is provided on the back surface of the drift layer 46. The buffer layer 47 may serve as a field stop layer that prevents the depletion layer extending from the back surfaces of the base regions 44 from reaching the collector layer 48. The collector layer 48 is provided in the IGBT region 80 on the back surface of the buffer layer 47, and the cathode layer 49 is provided in the diode region 90 on the back surface of the buffer layer 47. Furthermore, the collector electrode 56 is provided on the back surface of the collector layer 48 and the back surface of the cathode layer 49.

In the semiconductor substrate 40, the first trenches 10 and the second trenches 20 are provided on the front surface side of the semiconductor substrate 40. The length of the second trenches 20 in the second direction is larger than the length of the first trenches 10 in the second direction (i.e., the width 12).

The first trenches 10 and the second trenches 20 extend from the front surface of the semiconductor substrate 40, through the emitter and base regions 42 and 44 or the base regions 44, to reach the drift layer 46. The first and second trenches 10 and 20 each have a trench insulating film 54 and a trench electrode 52 in contact with the trench insulating film 54. The trench insulating film 54 and the trench electrode 52 are formed in the semiconductor substrate 40 on the front surface side thereof.

The trench insulating film 54 covers the inner wall of each trench. The trench insulating film 54 may be formed by oxidizing or nitrogenating the semiconductor material of the inner wall of the trench. The trench electrode 52 is positioned in the trench more inside than the trench insulating film 54 so that the trench electrode 52 is insulated from the semiconductor substrate 40. The trench electrode 52 may be made of an electrically conductive material such as polysilicon.

A first insulating film 72 is provided between the trench electrodes 52 and the emitter electrode 58. In addition, the side and front surfaces of the interconnection layer 50 are covered with a second insulating film 74, which electrically insulates the interconnection layer 50 from the emitter electrode 58. As shown in FIG. 2, the trench electrodes 52 in the second trenches 20 are electrically connected to the interconnection layer 50 through the interconnection layer contacts 62.

Figure 3:
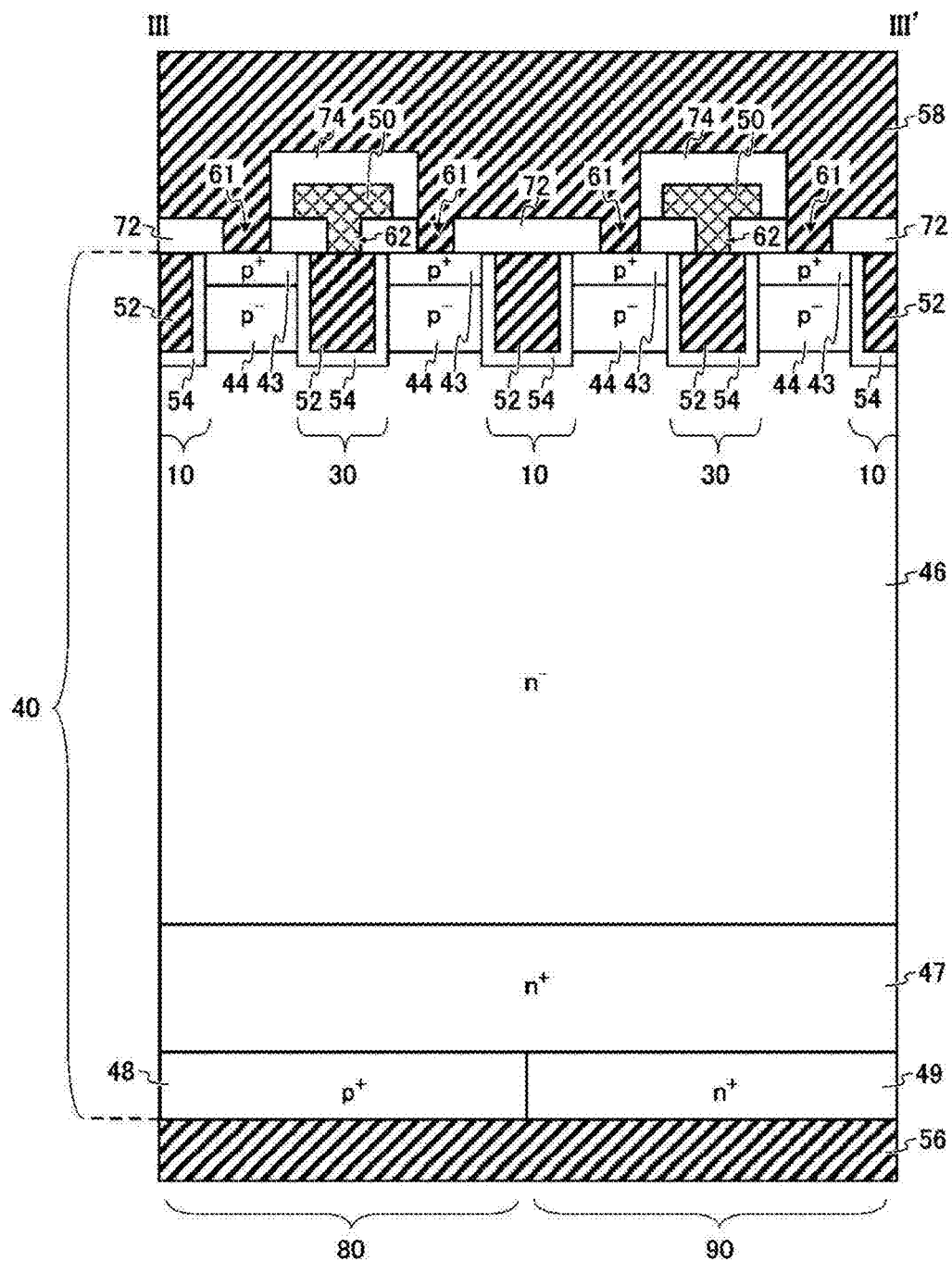
FIG. 3 is a cross-sectional view showing the semiconductor device 100 along III III' in FIG. 1.

FIG. 3 is a cross-sectional view showing the semiconductor device 100 along III III' in FIG. 1. The cross-section along is obtained by cutting in a direction parallel to the second direction the region that includes the first trenches 10 and the third trenches 30 and crosses the boundary between the IGBT region 80 and the diode region 90. The semiconductor substrate 40 further includes the contact regions 43 of the second conductivity type that are formed in the base regions 44 on the front surface side thereof. In the present exemplary embodiment, the contact regions 43 are of the $p^+$-type. The contact regions 43 are electrically connected to the emitter electrode 58 through the electrode contacts 61.

The trench electrodes 52 in the third trenches 30 are electrically connected to the interconnection layer 50 through the interconnection layer contacts 62. In the IGBT region 80, the trench electrodes 52 in the trenches are electrically connected to the gate electrode 59 through the electrode contacts 61 or the interconnection layer contacts 62. In response to application of a predetermined voltage to the trench electrodes 52, channels are formed in the base regions 44. Furthermore, in response to application of a predetermined voltage to the emitter electrode 58 and the collector electrode 56, currents flow from the collector electrode 56 to the emitter electrode 58.

In the diode region 90, the trench electrodes 52 in the trenches are electrically connected to the emitter electrode 58 through the electrode contacts 61 or the interconnection layer contacts 62. The emitter electrode 58 functions as an anode electrode, and the collector electrode 56 functions as a cathode electrode. In response to application of a predetermined voltage to the emitter electrode 58 and the collector electrode 56, currents flow from the emitter electrode 58 to the collector electrode 56.

Figure 4:
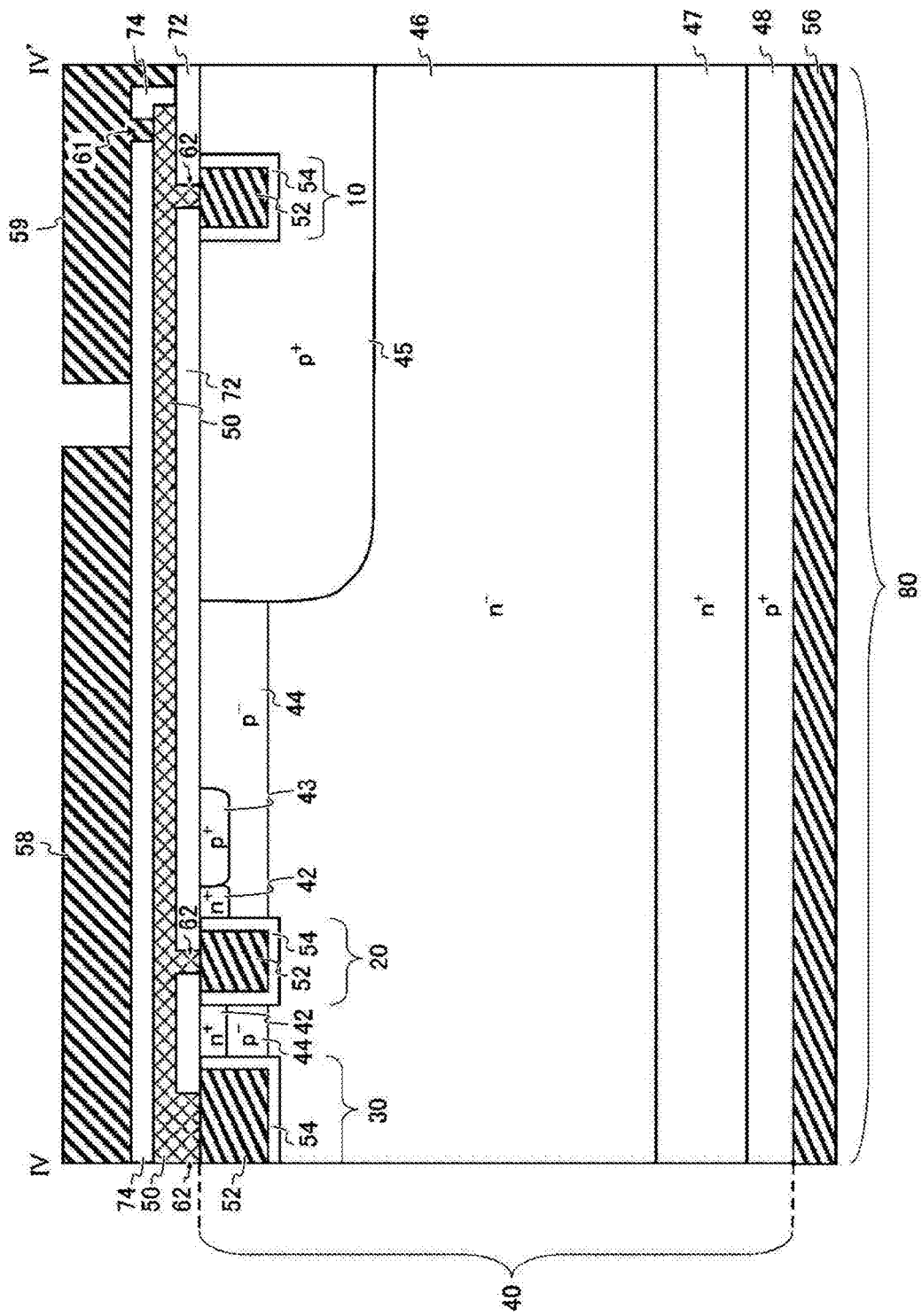
FIG. 4 is a cross-sectional view showing the semiconductor device 100 along IV-IV' in FIG. 1.

FIG. 4 is a cross-sectional view showing the semiconductor device 100 along IV-IV' in FIG. 1. The cross-section along IV-IV' is obtained by cutting in a direction parallel to the first direction the IGBT region 80 including the third trenches 30, the second trenches 20 and the first trenches 10. The semiconductor substrate 40 includes a well region 45 of the second conductivity type in the drift layer 46 on the front surface side thereof. In the present exemplary embodiment, the well region 45 is of the $p^+$-type.

The first trench 10 in the well region 45 corresponds to the curved portion of the U-shaped trench. The well region 45 extends beyond the bottom of the first trench 10 towards the back surface side of the drift layer 46. Therefore, even if a predetermined voltage is applied to the first trench 10, the channel and the collector electrode 56 may not be electrically connected in the well region 45. In the IGBT region 80, it may be only the first trenches 10 extending in the first direction which substantially help form the channels.

The interconnection layer 50 is electrically connected to the trench electrodes 52 in the trenches through the interconnection layer contacts 62. Furthermore, the interconnection layer 50 is electrically connected to the gate electrode 59 through the electrode contacts 61. The emitter electrode 58 and the gate electrode 59 are electrically separated from each other on the front surface of the well region 45.

The following describes one exemplary method of manufacturing the semiconductor device 100 relating to the first embodiment. However, the method for manufacturing the semiconductor device 100 is not limited to the following example. To begin with, the semiconductor substrate 40 is provided which has the same conductivity type as the drift layer 46 (in the present exemplary embodiment, $n^-$-type). Following this, an etching mask having a predetermined pattern is provided on the surface of the semiconductor substrate 40 to form the first trenches 10, the second trenches 20 and the third trenches 30.

Here, the openings in the mask to form the respective trenches have the same width. After grooves are formed, the trench insulating films 54 are formed on the inner walls of the grooves, and the grooves are then filled with the trench electrodes 52.

Subsequently, p-type impurities are injected into the semiconductor substrate 40 from the front surface thereof. The semiconductor substrate 40 is then thermally treated for approximately two hours at a temperature of approximately 1100° C. As a result, the p-type base region 44, which is shallower than the trenches, is formed in the semiconductor substrate 40 across the entire front surface.

Following this, an etching mask having therein openings positioned corresponding to the emitter regions 42 is used to selectively inject n-type impurities into the semiconductor substrate 40 from the front surface thereof. This selectively forms the emitter regions 42 of the $n^+$-type within the p-type base region 44. After this, the interconnection layer 50, the emitter electrode 58, the first insulating film 72, the second insulating film 74 and the like are formed as appropriate on the front surface of the semiconductor substrate 40. In addition, contact holes are formed in the first insulating film 72 and the second insulating film 74 and treated as the electrode contacts 61 and the interconnection layer contacts 62.

Subsequently, selenium (Se) ions are implanted into the semiconductor substrate 40 from the back surface thereof at a concentration of, for example, approximately $1.0 \times 10^{14}/cm^2$, and the semiconductor substrate 40 is then thermally treated for approximately two hours at a temperature of approximately 900° C. This forms the $n^+$-type buffer layer 47 in the semiconductor substrate 40 on the back surface side thereof. A portion of the semiconductor substrate 40 that is positioned on the front surface side with respect to the $n^+$-type buffer layer 47 serves as the $n^-$-type drift layer 46. The buffer layer 47 can be formed at a deep position (closer to the front surface of the semiconductor substrate 40) due to the use of selenium, which exhibits a high diffusion coefficient. Furthermore, the semiconductor substrate 40 may be subjected to polishing before the buffer layer 47 is formed in order to adjust the thickness.

Instead of implanting selenium ions, the n⁺-type buffer layer 47 may be formed by performing ion implantation of protons at a plurality of times at different doses. This can form a buffer layer 47 in which the impurity concentration increases in the semiconductor substrate 40 from the front surface side to the back surface side.

Following this, ion implantation of p-type impurities are performed on the back surface of the semiconductor substrate 40 at a dose of, for example, no less than $1.0 \times 10^{13}/cm^2$ and no more than $4.0 \times 10^{13}/cm^2$ in the region corresponding to the IGBT region 80. This can form the p⁺-type collector layer 48 having a smaller thickness than the buffer layer 47 in the semiconductor substrate 40 on the back surface side. The dose of less than $1.0 \times 10^{13}/cm^2$ for the p-type impurities is not desirable since the collector layer 48 and the collector electrode 56 cannot form ohmic junction. In addition, n-type impurities are injected into the region corresponding to the diode region 90 at a similar dose to that of the impurities for the collector layer 48, for example, at a dose of no less than $1.0 \times 10^{14}/cm^2$ and no more than $1.0 \times 10^{16}/cm^2$, to form the n⁺-type cathode layer 49 having a smaller thickness than the buffer layer 47. After this, the collector electrode 56 and the like are formed on the back surface of the semiconductor substrate 40 as needed.

Figure 5:
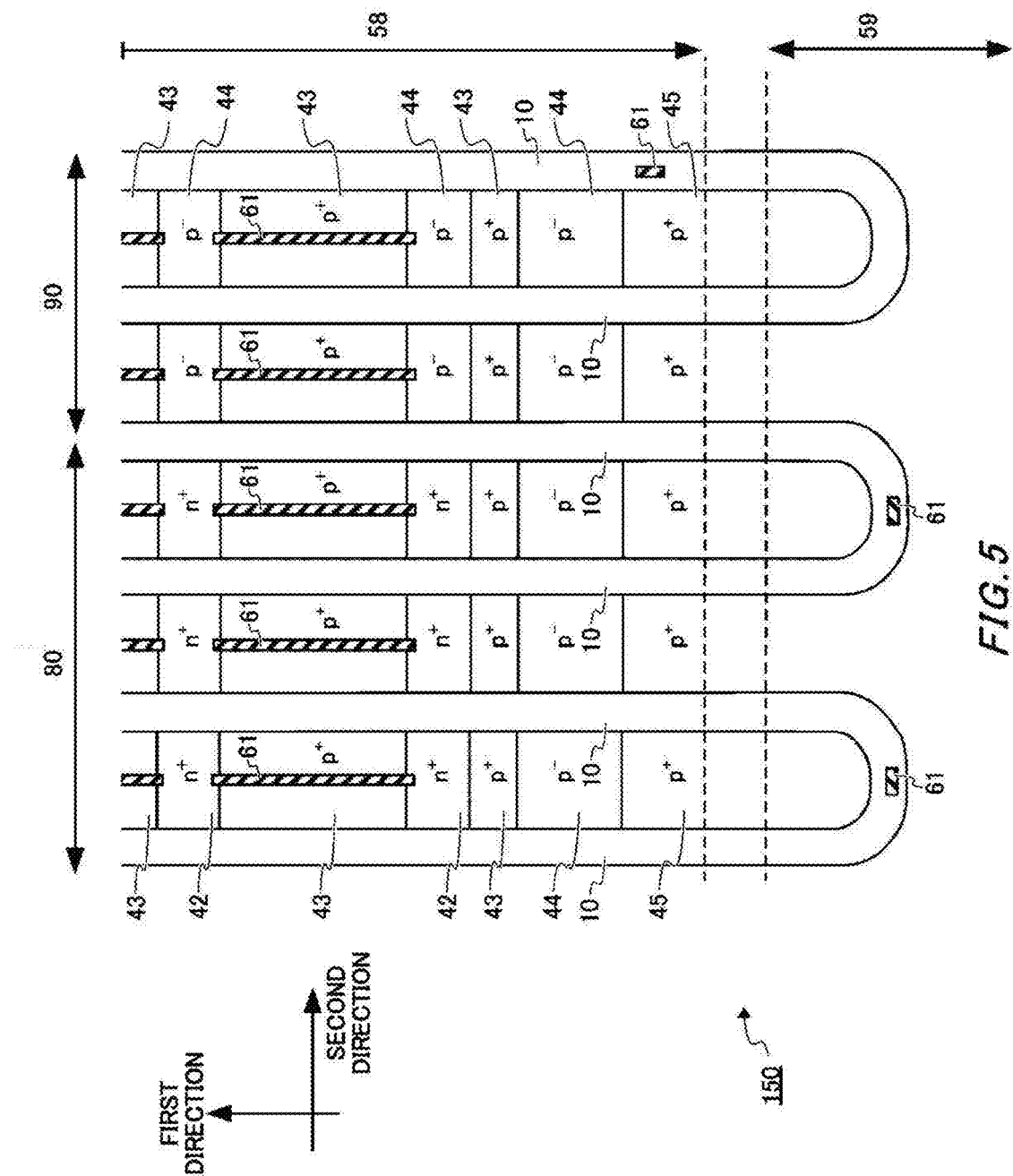
FIG. 5 shows a semiconductor device 150 relating to a comparative example.

FIG. 5 shows a semiconductor device 150 relating to a comparative example. The semiconductor device 150 relating to the present example is different from the semiconductor device 100 shown in FIGS. 1 to 4 in that the second trenches 20, the third trenches 30, the interconnection layer 50 and the interconnection layer contacts 62 are not provided. Therefore, the distance between the longitudinal portions of the first tranches 10 extending in the first direction is shorter in the semiconductor device 150 than in the semiconductor device 100.

Since the semiconductor device 150 does not include the second trenches 20 and the third trenches 30, the carrier accumulation effect is lower than in the semiconductor device 100. Accordingly, the semiconductor device 150 has a higher on-voltage for the IGBT region 80.

In the IGBT region 80, the first trenches 10 are electrically connected at the curved portion of the U-shaped trenches to the gate electrode 59 through the electrode contacts 61. In the diode region 90, the first trenches 10 are electrically connected at the longitudinal portions of the U-shaped trenches extending in the first direction to the emitter electrode 58 through the electrode contacts 61.

Figure 6:
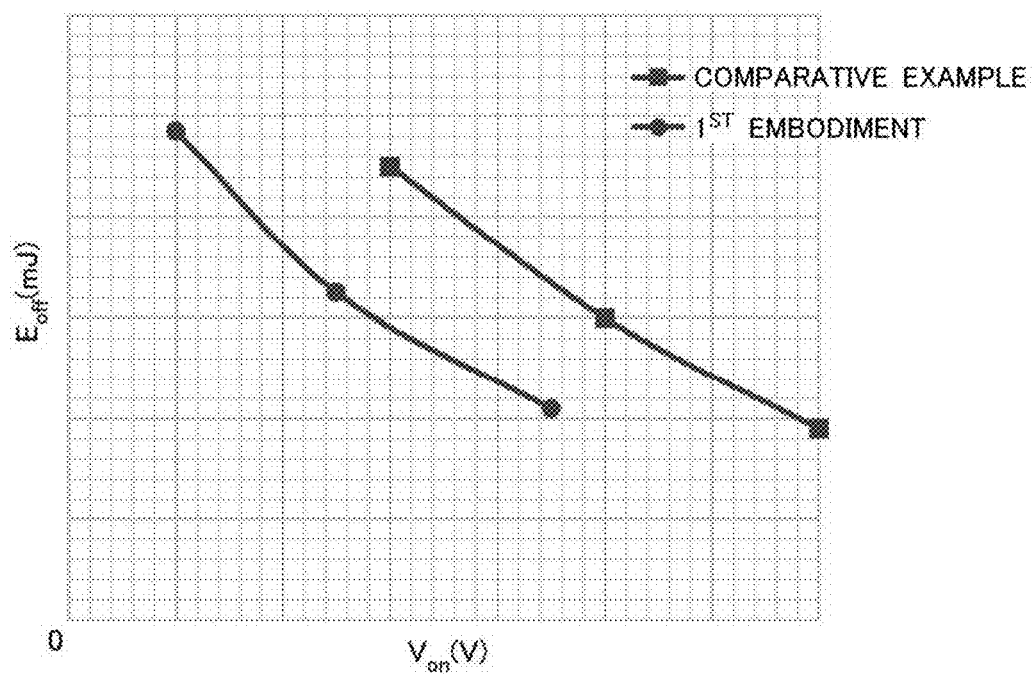
FIG. 6 is a graph showing the relation between the on-voltage ($V_{on}$) and the turn-off power loss ($E_{off}$) for the semiconductor device 100 relating to the first embodiment and the semiconductor device 150 relating to the comparative example.

FIG. 6 is a graph showing the relation between the on voltage ($V_{on}$) and the turn-off power loss ($E_{off}$) for the semiconductor device 100 relating to the first embodiment and the semiconductor device 150 relating to the comparative example. The semiconductor device 100 relating to the first embodiment produces higher IE effects because the semiconductor device 100 relating to the first embodiment has the first trenches 10, the second trenches 20 and the third trenches 30 while the semiconductor device 150 relating to the comparative example only has the first trenches 10. Accordingly, the first embodiment can achieve a lower on-voltage ($V_{on}$) than the comparative example. As a result, the first embodiment can achieve significantly improved $V_{on}$-$E_{off}$ characteristics.

Figure 7:
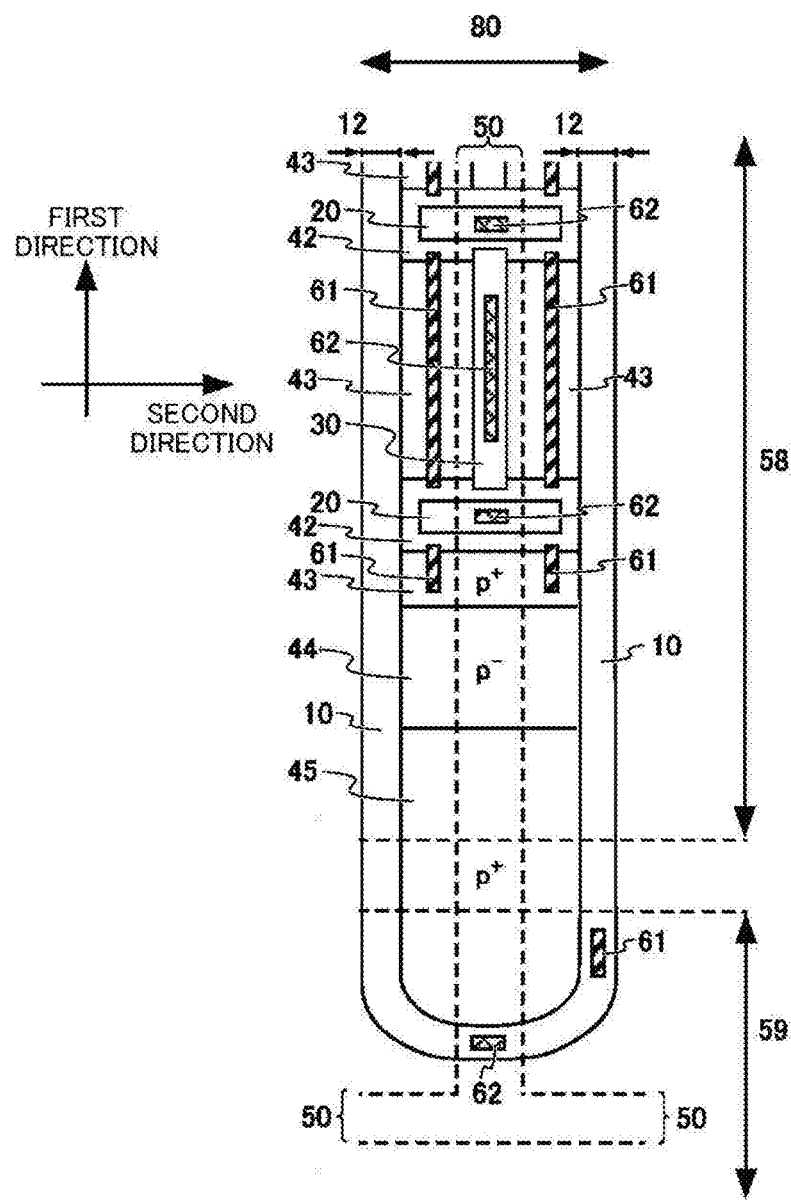
FIG. 7 shows a first modification example in which a third trench 30 in an IGBT region 80 is modified.

FIG. 7 shows a first modification example in which the third trenches 30 in the IGBT region 80 are modified. In the present example, each third trench 30 extends in the contact region 43 and at least one emitter region 42 adjacent to the contact region 43. In other words, the third trench 30 is longer in the first direction than in the first embodiment. In this respect, the first modification example is different from the first embodiment. Except for this, the first modification example may be the same as the first embodiment.

The third trench 30 can be positioned as close as possible to the second trenches 20 provided that the third trench 30 is spatially spaced away from the second trenches 20. In accordance with the above-described definition of the phrase "spatially spaced away," the second trenches 20 and the third trench 30 may have adjacent trench insulating films 54 or share a common trench insulating film 54. In this manner, this modification example can produce even higher IE effects than the first embodiment.

Figure 8:
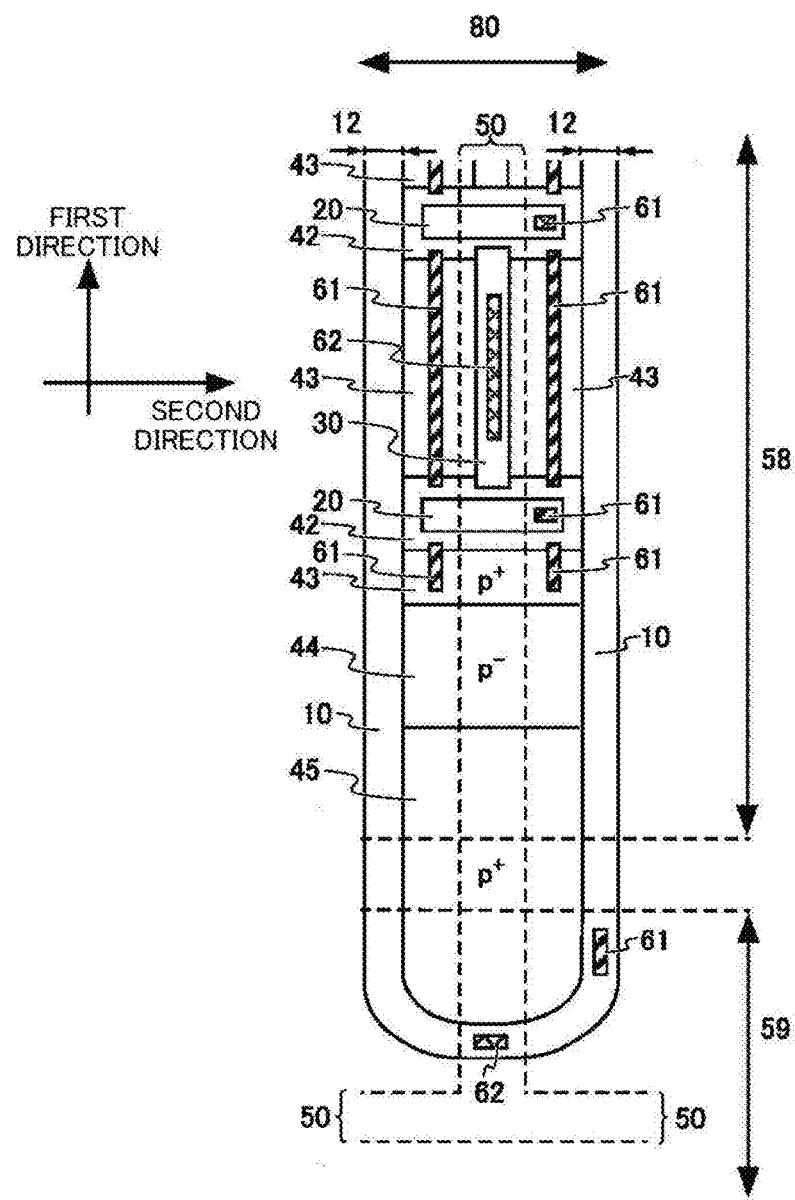
FIG. 8 shows a second modification example in which a second trench 20 in the IGBT region 80 is modified.

FIG. 8 shows a second modification example in which the second trenches 20 in the IGBT region 80 are modified. In the present example, the second trenches 20 are not connected to the interconnection layer 50 through the interconnection layer contacts 62 but electrically connected to the emitter electrode 58 through the electrode contacts 61. In this respect, this modification example is different from the first modification example. Except for this, the second modification example may be the same as the first modification example.

In the present example, while the IGBT region 80 is turned on, the trench electrodes 52 of the second trenches 20 have the same potential as the emitter electrode 58, not as the gate electrode 59. Stated differently, the second trenches 20 serve as dummy trenches, not as so-called trench gates, while the IGBT region 80 is turned on. The second modification example can also produce higher IE effects than the comparative example shown in FIG. 5.

Figure 9:
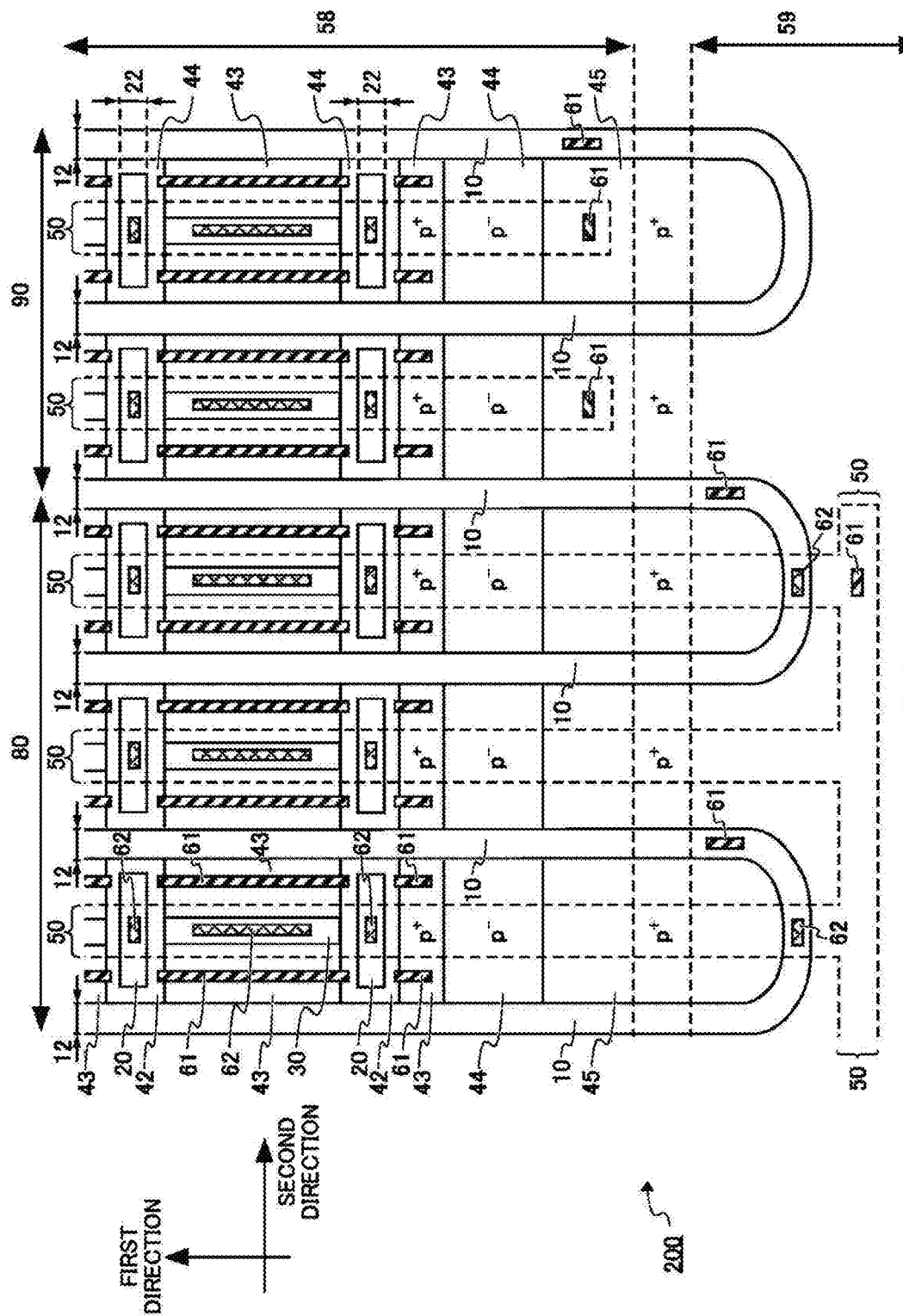
FIG. 9 is a top schematic view illustrating a semiconductor device 200 relating to a second embodiment.

FIG. 9 is a top schematic view illustrating a semiconductor device 200 relating to a second embodiment. According to the present exemplary embodiment, in the diode region 90, the interconnection layer 50 is provided on the back surface of the emitter electrode 58 but not on the back surface of the gate electrode 59. The interconnection layer 50 is electrically connected to the emitter electrode 58 through the electrode contacts 61 that are positioned in the vicinity of the boundary between the emitter electrode 58 and the gate electrode 59 and above the well region 45. In this respect, the second embodiment is different from the first embodiment. Except for this, the second embodiment may be the same as the first embodiment. The second embodiment can achieve similar IE effects and $V_{on}$-$E_{off}$ characteristics to the first embodiment. Note that the second embodiment may be combined with the first modification example (FIG. 7) or the second modification example (FIG. 8).

Figure 10:
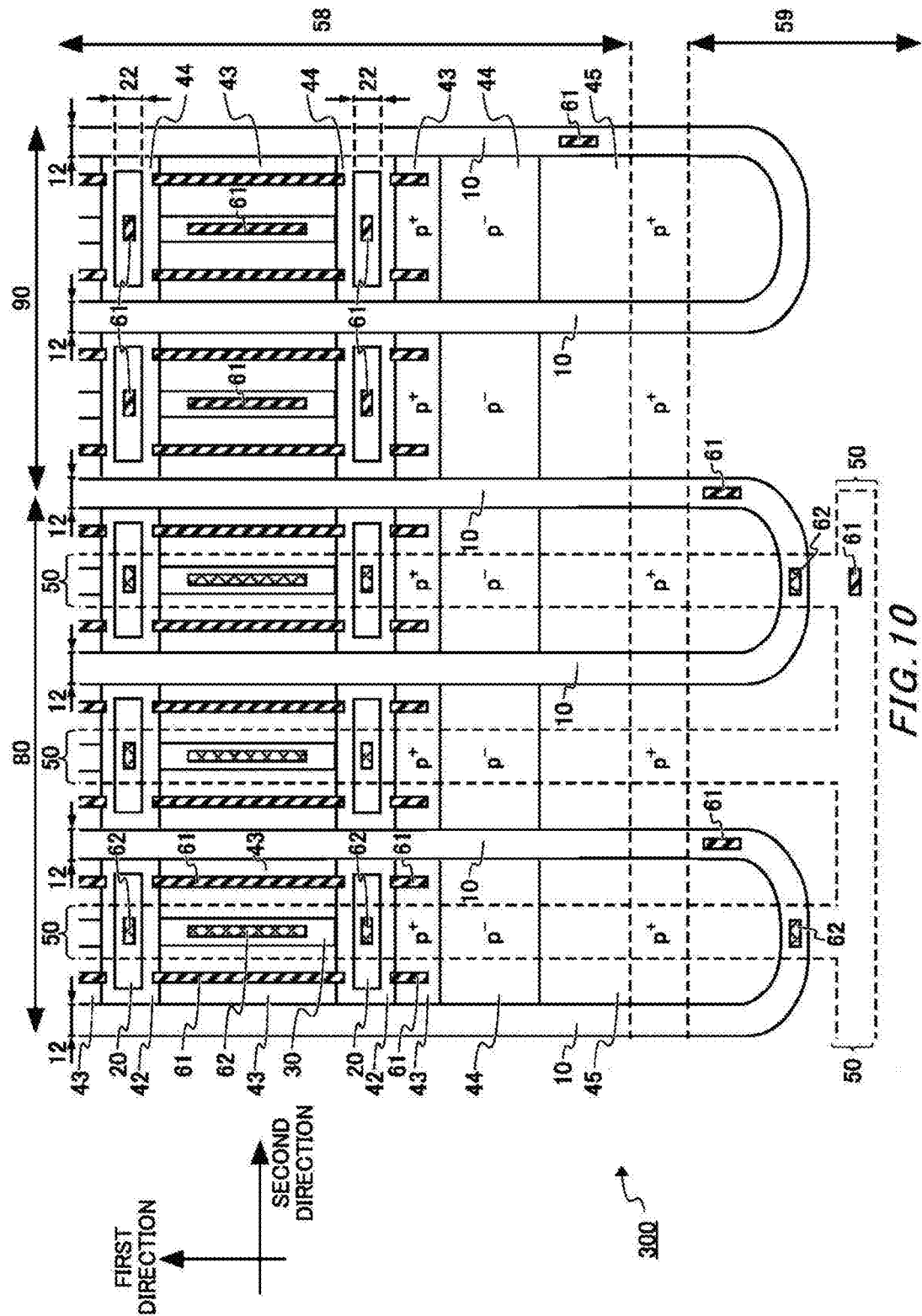
FIG. 10 is a top schematic view illustrating a semiconductor device 300 relating to a third embodiment.

FIG. 10 is a top schematic view illustrating a semiconductor device 300 relating to a third embodiment. In the present exemplary embodiment, the interconnection layer 50 is not provided at all in the diode region 90. Accordingly, the second trenches 20 and the third trenches 30 may be electrically connected to the emitter electrode 58 through the electrode contacts 61. In this respect, the third embodiment is different from the first embodiment. Except for this, the third embodiment may be the same as the first embodiment. While the third embodiment produces lower stress relaxation effects within the package than the first embodiment, the third embodiment can still achieve similar IE effects and $V_{on}$-$E_{off}$ characteristics to the first embodiment. Note that the third embodiment may be combined with the first modification example (FIG. 7) or the second modification example (FIG. 8).

Figure 11:
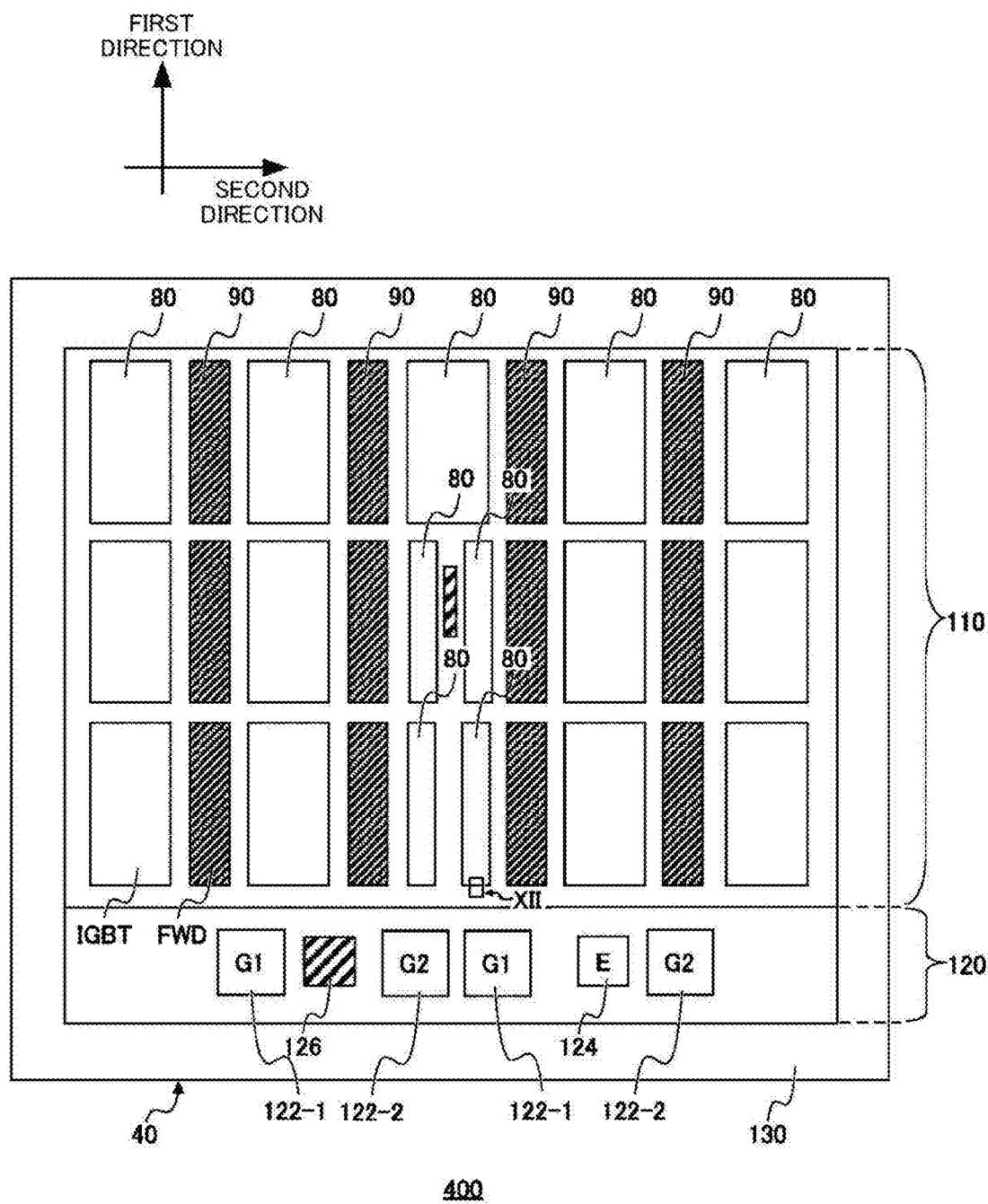
FIG. 11 is an overall schematic top view showing a semiconductor device 400 relating to a fourth embodiment.

FIG. 11 is an overall schematic top view showing a semiconductor device 400 relating to a fourth embodiment.

The semiconductor device 400 has an active region 110, a pad region 120 and a surrounding region 130. The surrounding region 130 surrounds the active region 110 and the pad region 120 in the plane defined by the first direction and the second direction. The surrounding region 130 may include a breakdown voltage structure therein. The breakdown voltage structure may include a guard ring, a field plate and the like.

The active region 110 includes a plurality of IGBT regions 80 and a plurality of diode regions 90. In FIG. 11, one IGBT region 80 is indicated by a plain rectangular block and one diode region 90 is indicated by a shaded rectangular block. The boundary portion between a IGBT region 80 and a diode region 90 adjacent to each other in the second direction may be configured in the same manner as in the first to third embodiments. Note that the shaded region at the center of the active region 110 denotes a diode for sensing a temperature.

In the present exemplary embodiment, the pad region 120 includes gate pads 122, emitter pads 124 (indicated by the letter "E" in FIG. 11) and a protection diode 126 between the gate electrode and the emitter electrode. In the present exemplary embodiment, the gate pads 122 include a first gate pad 122-1 (indicated by the letter "G1" in FIG. 11) and a second gate pad 122-2 (indicated by the letter "G2" in FIG. 11). In the present exemplary embodiment, the first gate pad 122-1 and the second gate pad 122-2 respectively receive independent control signals.

Figure 12:
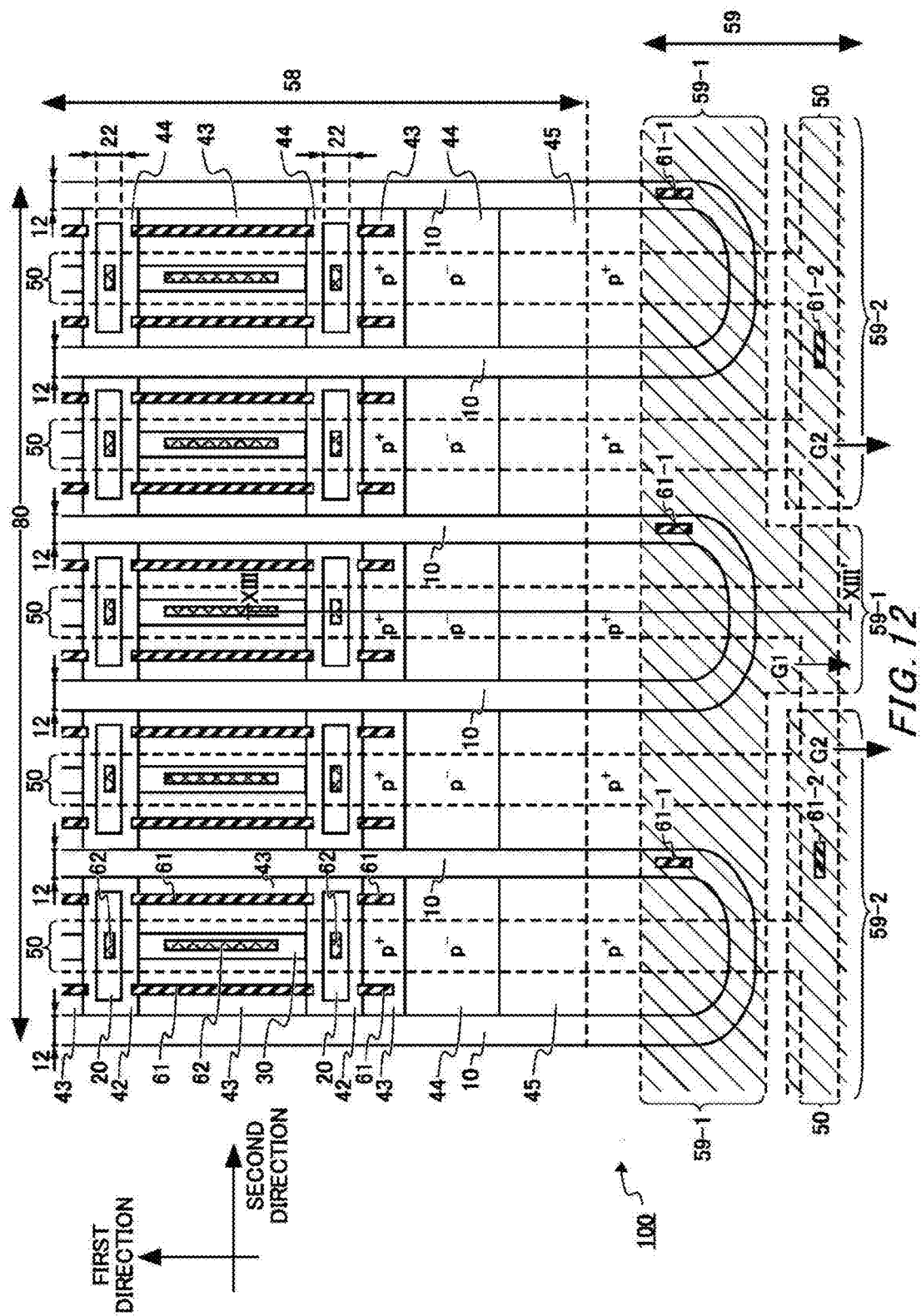
FIG. 12 is an enlarged view showing a region XII in FIG. 11.

FIG. 12 is an enlarged view showing a region XII in FIG. 11. In the present exemplary embodiment, the gate electrode 59 includes a gate electrode 59-1 and a gate electrode 59-2. The gate electrode 59-1 is a first electrode layer electrically connected to the trench electrodes 52 in the first trenches 10. The gate electrode 59-1 is electrically connected to the trench electrodes 52 in the first trenches 10 through electrode contacts 61-1. The gate electrode 59-2 is a second electrode layer electrically connected to the trench electrodes 52 in the second trenches 20. The gate electrode 59-2 is electrically connected to the trench electrodes 52 in the second trenches 20 and the third trenches 30 through electrode contacts 61-2, the interconnection layer 50 and the interconnection layer contacts 62.

The gate electrode 59-1 in the active region 110 is electrically connected to the first gate pad 122-1 (G1) in the pad region 120. The gate electrode 59-2 in the active region 110 is electrically connected to the second gate pad 122-2 (G2) in the pad region 120. In this manner, the control signal input into the first gate pad 122-1 (G1) turns on and off the first trenches 10, and the control signal input into the second gate pad 122-2 (G2) t turns on and off the second trenches 20 and the third trenches 30.

Figure 13:
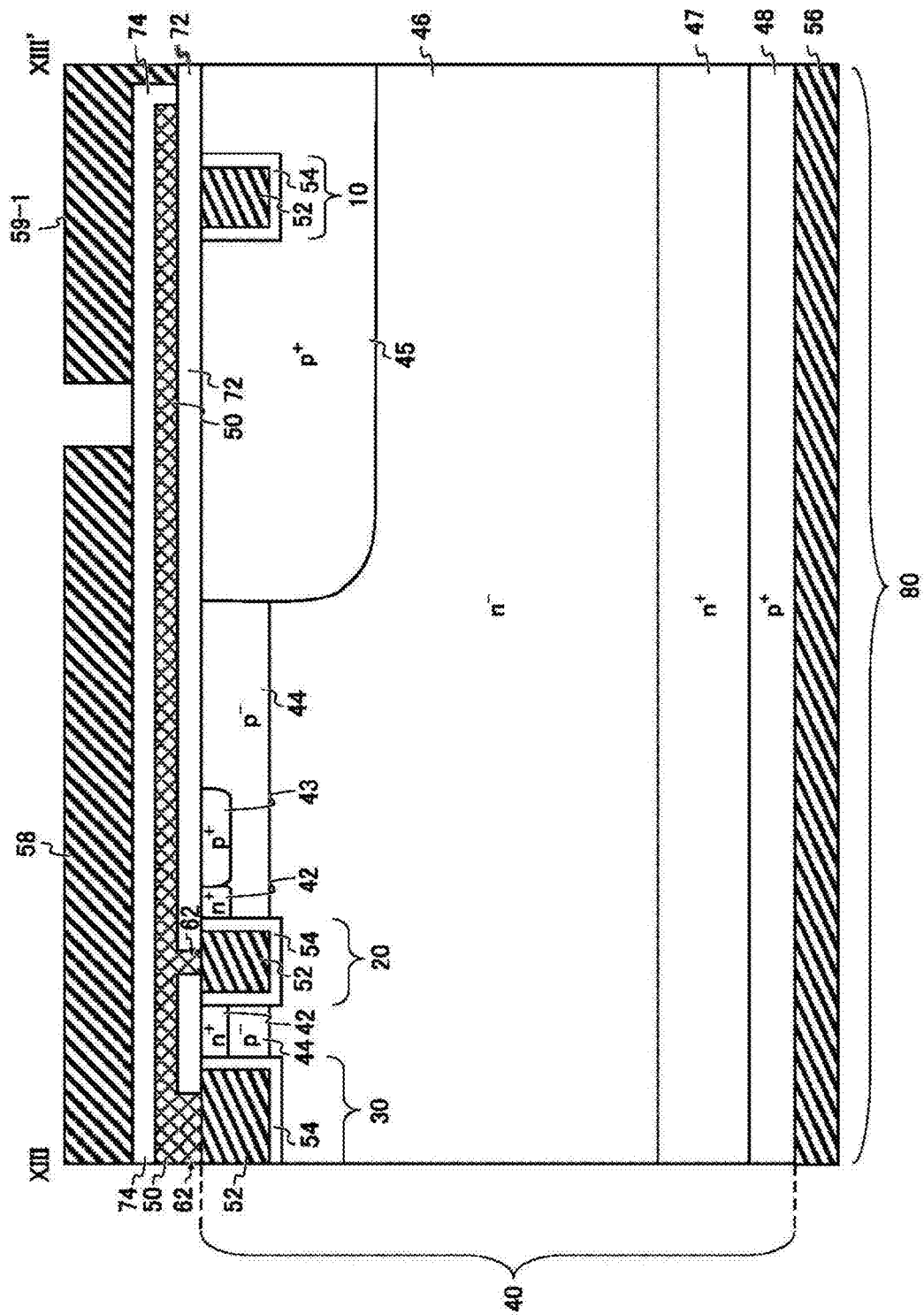
FIG. 13 is a cross-sectional view showing the region XII along XIII-XIII' in FIG. 12.

FIG. 13 is a cross-sectional view showing the region XII along XIII-XIII' in FIG. 12. FIG. 13 corresponds to FIG. 4 showing the first embodiment. It should be noted that the first trench 10 is not electrically connected to the interconnection layer 50 in the present exemplary embodiment. Therefore, in the p$^+$-type well region 45, the trench electrode 52 in the first trench 10 is electrically separated by the first insulating film 72 from the interconnection layer 50. In this respect, FIG. 13 is different from FIG. 4.

Figure 14:
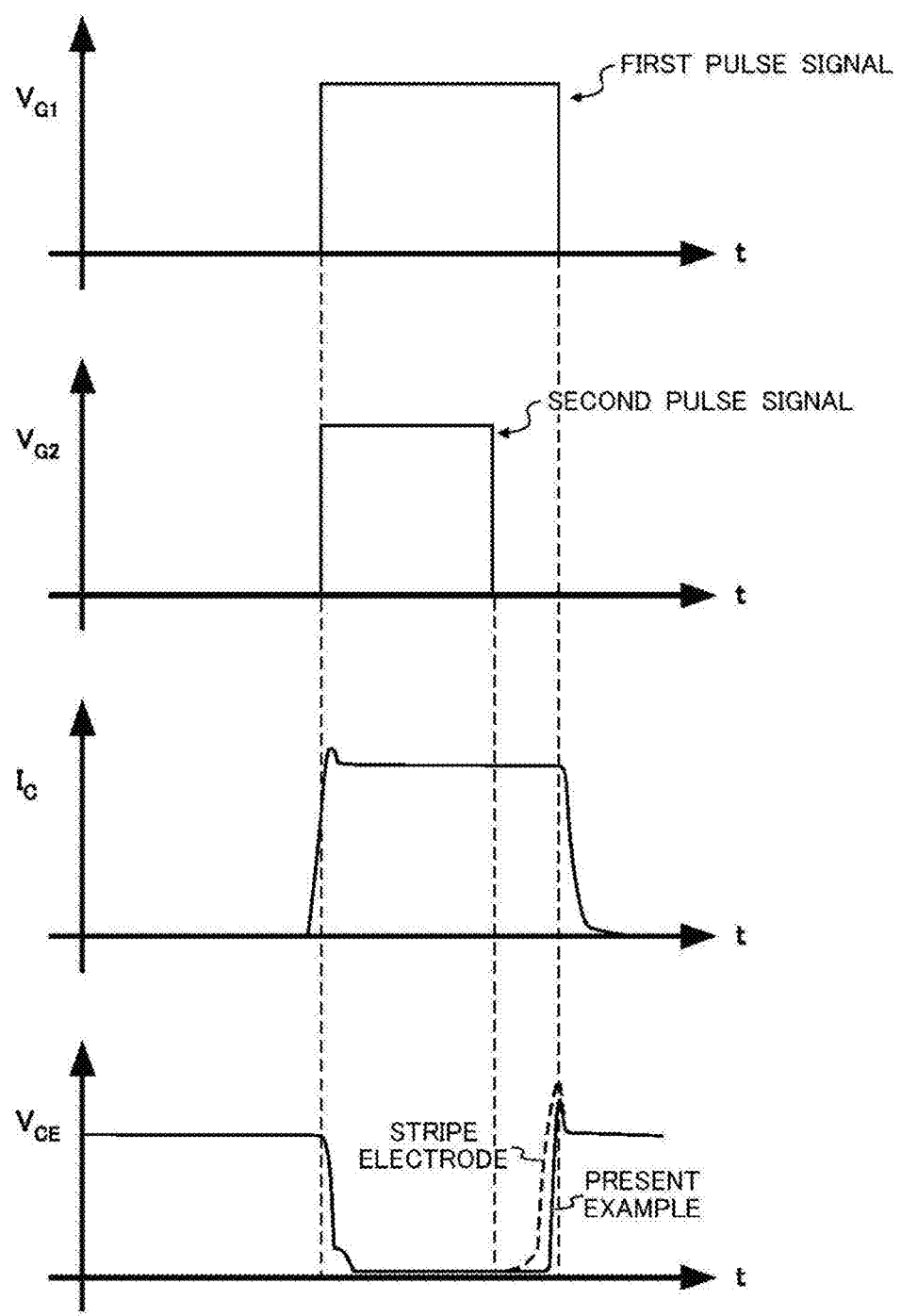
FIG. 14 is a timing chart to illustrate the parameters $V_{G1}$, $V_{G2}$, $I_C$ and $V_{CE}$.

FIG. 14 is a timing chart to illustrate the parameters $V_{G1}$, $V_{G2}$, $I_C$ and $V_{CE}$. The parameter $V_{G1}$ indicates the voltage waveform of the control signal input into the first gate pad 122-1 (G1). The parameter $V_{G2}$ indicates the voltage waveform of the control signal input into the second gate pad 122-2 (G2). The parameter $I_C$ indicates the waveform of the currents flowing from the collector electrode 56 to the emitter electrode 58. The parameter $V_{CE}$ indicates the waveform of the voltage of the collector electrode 56 with respect to the emitter electrode 58. The parameters $V_{G1}$, $V_{G2}$ and $V_{CE}$ are represented in units of [V] and the parameter $I_C$ is represented in units of [A]. The horizontal axis represents time in the respective graphs.

In the present exemplary embodiment, the first gate pad 122-1 (G1) receives a first pulse signal $V_{G1}$, and the second gate pad 122-2 (G2) receives a second pulse signal $V_{G2}$. In the present exemplary embodiment, the first pulse signal $V_{G1}$ is the control signal to cause channels to be formed in the vicinity of the first trenches 10, and the second pulse signal $V_{G2}$ is the control signal to cause channels to be formed in the vicinity of the second trenches 20 and the third trenches 30. In other examples where the third trenches 30 are not provided, the second pulse signal $V_{G2}$ may be the control signal to cause channels to be formed only in the vicinity of the second trenches 20.

In the present exemplary embodiment, the pulse signal input into one of (i) the first trenches 10 and (ii) the second and third trenches 20 and 30 which has a smaller front surface area is controlled to transition to a low-level potential earlier than the pulse signal input into the other which has a larger front surface area. Specifically speaking, when the front surface area of the second and third trenches 20 and 30 is smaller than the front surface area of the first trenches 10, the second pulse signal $V_{G2}$ transitions to a low-level potential earlier than the first pulse signal $V_{G1}$. On the other hand, when the front surface area of the first trenches 10 is smaller than the front surface area of the second and third trenches 20 and 30, the first pulse signal $V_{G1}$ transitions to a low-level potential earlier than the second pulse signal $V_{G2}$.

In the present exemplary embodiment, the phrase "the front surface area of the trenches" indicates the total area of the trench electrodes 52 at the front surface of the semiconductor substrate 40. In the present exemplary embodiment, the front surface area of the second and third trenches 20 and 30 is smaller than the front surface area of the first trenches 10. Accordingly, the second pulse signal $V_{G2}$ is turned off earlier than the first pulse signal $V_{G1}$.

The first and second pulse signals $V_{G1}$ and $V_{G2}$ may take identical values for the high and low-level potential. The first and second pulse signals $V_{G1}$ and $V_{G2}$ both maintain the high-level potential for a predetermined period and one of the first and second pulse signals $V_{G1}$ and $V_{G2}$ transitions to the low-level potential earlier than the other. In the present exemplary embodiment, the first and second pulse signals $V_{G1}$ and $V_{G2}$ simultaneously rise to the high-level potential and both maintain the high-level potential for a predetermined period, after which the second pulse signal $V_{G2}$ drops to the low-level potential earlier than the first pulse signal $V_{G1}$.

By turning off one of the first and second pulse signals $V_{G1}$ and $V_{G2}$ earlier than the other, charges remain accumulated in the vicinity of the turned-off trench electrodes 52 in the drift layer 46 on the front surface side thereof. This can produce the IE effects.

The graph showing $V_{CE}$ in FIG. 14 uses the dotted line to represent the qualitative behavior of the saturation voltage of $V_{CE}$ observed when the stripe electrode pattern disclosed in Japanese Patent Application No. 2000-101076 is employed. When compared with the stripe electrode pattern, the present example can reduce the saturation voltage of $V_{CE}$ after the second pulse signal $V_G 2$ is turned off. In other words, the present example can reduce the on-voltage ($V_{on}$) when compared with the stripe electrode pattern. In addition, the present example can reduce the surge voltage observed when the first pulse signal $V_{G1}$ is turned off, compared with the stripe electrode pattern.

Since the front surface area of the second and third trenches 20 and 30 is smaller than the front surface area of the first trenches 10 in the present exemplary embodiment, the parasitic capacitance $C_{cg2}$ between the second and third trenches 20 and 30 and the collector electrode 56 is lower than the parasitic capacitance $C_{cg1}$ between the first trenches 10 and the collector electrode 56. By controlling the pulse signal input into the trenches having a lower parasitic capacitance $C_{cg}$ to transition to a low-level potential earlier, the present exemplary embodiment can produce the IE effects with the influences on the original on-off characteristics of the trench gates being minimized.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10 . . . first trench, 12 . . . width, 20 . . . second trench, 22 . . . width, 30 . . . third trench, 40 . . . semiconductor substrate, 42 . . . emitter region, 43 . . . contact region, 44 . . . base region, 45 . . . well region, 46 . . . drift layer, 47 . . . buffer layer, 48 . . . collector layer, 49 . . . cathode layer, 50 . . . interconnection layer, 51 . . . disconnecting portion, 52 . . . trench electrode, 54 . . . trench insulating film, 56 . . . collector electrode, 58 . . . emitter electrode, 59 . . . gate electrode, 61 . . . electrode contact, 62 . . . interconnection layer contact, 72 . . . first insulating film, 74 . . . second insulating film, 80 . . . IGBT region, 90 . . . diode region, 100 . . . semiconductor device, 110 . . . active region, 120 . . . pad region, 122 . . . gate pad, 124 . . . emitter pad, 130 . . . surrounding region, 126 . . . protective diode, 150 . . . semiconductor device, 200 . . . semiconductor device, 300 . . . semiconductor device, 400 . . . semiconductor device

What is claimed is:

1. A semiconductor device comprising:
three or more first trenches, extending in a first direction, with respect to a schematic top view;
two second trenches provided on a front surface side of a semiconductor substrate directly between adjacent first trenches, each second trench being spatially spaced away from the first trenches, extending perpendicular to the first direction, with respect to the schematic top view, and being shorter than any of the first trenches; and
a third trench formed on the front surface side of the semiconductor substrate directly between the two second trenches in the first direction and directly between the adjacent first trenches in the second direction, and spatially spaced away from each of the first and second trenches, the third trench extending in the same direction as the first trench, with respect to the schematic top view,
wherein
the first trench and the third trench are alternately arranged side by side, with respect to the schematic top view, and
the first, second and third trenches each include:
an inner wall that extends inwardly from the front surface side of the semiconductor substrate;
a trench insulating film that covers the inner wall, and
a trench electrode that is positioned in the trench and is in contact with the trench insulating film.

2. The semiconductor device as set forth in claim 1, wherein
each of the three or more first trenches has the same width as each of the two second trenches.

3. The semiconductor device as set forth in claim 2, wherein each of the three or more first trenches and the two second trenches have the same width as the third trench.

4. The semiconductor device as set forth in claim 1 further comprising
one or more first-conductivity-type regions and one or more second-conductivity type regions that are provided in the semiconductor substrate on the front surface side thereof, the first-conductivity-type regions and the second-conductivity type regions being alternately arranged along the first direction, wherein
each second trench is provided in at least one of the first-conductivity-type regions.

5. The semiconductor device as set forth in claim 4, wherein
at least a partial region of the third trench is in one of the second-conductivity-type regions.

6. The semiconductor device as set forth in claim 5, wherein
the entire region of the third trench is in the one of the second-conductivity-type regions.

7. The semiconductor device as set forth in claim 5, wherein
the third trench extends in the one of the second-conductivity-type regions and at least one of the first-conductivity-type regions adjacent to the one of the second-conductivity-type regions.

8. The semiconductor device as set forth in claim 4, wherein
the one or more second-conductivity type regions contact adjacent two first trenches.

9. The semiconductor device as set forth in claim 4, further comprising:
a first-conductivity-type drift layer included in the semiconductor substrate; and
a second-conductivity-type base region provided at a front surface of the semiconductor substrate, wherein
a concentration of the second-conductivity-type base region is higher than a concentration of the first-conductivity-type drift layer,
the first, second and third trenches directly contact the first-conductivity-type drift layer, the front surface of the semiconductor substrate, and the second-conductivity-type base region, and
the first-conductivity-type regions and the second-conductivity type regions are provided on a surface of the second conductivity-type base region.

10. The semiconductor device as set forth in claim 1 further comprising
an interconnection layer electrically connecting together the trench electrodes in the first trenches and the trench electrode in the second trench.

11. The semiconductor device as set forth in claim 10, wherein
the second trenches are provided to be adjacent to each other in the first direction in the predetermined region, and
the interconnection layer extends in the first direction and is electrically connected to the second trenches.

12. The semiconductor device as set forth in claim 10, wherein
the three or more first trenches are arranged in a direction perpendicular to the first direction, and
the interconnection layer extends in the direction perpendicular to the first direction and is electrically connected to the second trench in each of the predetermined regions.

13. The semiconductor device as set forth in claim 10, further comprising
an electrode layer electrically connected to a portion of the predetermined region of the semiconductor substrate, wherein
the interconnection layer is formed between the electrode layer and the semiconductor substrate.

14. The semiconductor device as set forth in claim 13, wherein
the semiconductor device includes an IGBT region and a diode region,
the IGBT region and the diode region each have the first trenches, the second trenches and the interconnection layer,
the interconnection layer in each of the IGBT region and the diode region is electrically connected to the trench electrodes in the corresponding first and second trenches,
the electrode layer is electrically connected to the trench electrodes in the first and second trenches in the diode region, and
the interconnection layer in the IGBT region is electrically disconnected from the interconnection layer in the diode region.

15. The semiconductor device as set forth in claim 10, further comprising
an electrode contact that is formed between a first trench among the three or more first trenches and the third trench, and electrically connects together a portion of the predetermined region of the semiconductor substrate and the electrode layer, the electrode contact extending in the first direction, wherein
the electrode contact is spatially spaced away from each of the first, second and third trenches.

16. The semiconductor device as set forth in claim 15, wherein the interconnection layer is electrically connected to a gate electrode through the electrode contact.

17. The semiconductor device as set forth in claim 1, further comprising:
an interconnection layer electrically connected to the trench electrode in the second trench; and
an electrode layer provided on the interconnection layer, wherein
the electrode layer includes:
a first electrode layer electrically connected to the trench electrodes in the first trenches; and
a second electrode layer electrically connected to the trench electrode in the second trenches.

18. The semiconductor device as set forth in claim 17, wherein
the third trench includes a trench insulating film and a trench electrode in contact with the trench insulating film, and
the second electrode layer is electrically connected to the trench electrode in the third trench.

19. The semiconductor device as set forth in claim 18, wherein
a first pulse signal is input into the first electrode layer,
a second pulse signal is input into the second electrode layer,
the first pulse signal and the second pulse signal both have a high-level potential over a predetermined period, and
one of the first pulse signal and the second pulse signal that is input into one of (i) the first trenches and (ii) the second and third trenches that have a smaller front surface area transitions to a low-level potential earlier than the other of the first pulse signal and the second pulse signal.

20. The semiconductor device as set forth in claim 1, wherein
the adjacent first trenches are connected at respective ends in the first direction by a curved portion to form a U-shaped trench.

21. The semiconductor device as set forth in claim 1, wherein each second trench extends a shorter distance than a distance that any of the first trenches extend.

22. A semiconductor device comprising:
three or more first trenches, extending in a first direction, with respect to a schematic top view;
two second trenches provided on a front surface side of a semiconductor substrate directly between adjacent first trenches, each second trench being spatially spaced away from the first trenches, extending perpendicular to the first direction, with respect to the schematic top view, and being shorter than any of the first trenches;
a third trench formed on the front surface side of the semiconductor substrate directly between the two second trenches in the first direction and directly between the adjacent first trenches in the second direction, and spatially spaced away from each of the first and second trenches, the third trench extending in the same direction as the first trench, with respect to the schematic top view; and
one or more first-conductivity-type regions and one or more second-conductivity type regions that are provided in the semiconductor substrate on the front surface side thereof, the first-conductivity-type regions and the second-conductivity type regions being alternately arranged along the first direction, wherein
the first trench and the third trench are alternately arranged side by side, with respect to the schematic top view,
each second trench is provided in at least one of the first-conductivity-type regions,
the first, second and third trenches each include:
a trench insulating film, and
a trench electrode in contact with the trench insulating film, wherein
two of the three or more first trenches are portions of a U-shaped trench,
one of the one or more second-conductivity type regions is spatially spaced away from one of the second trenches that is closest to a curved portion of the U-shaped trench in the first direction, and is formed between the closest one of the second trenches and the curved portion of the U-shaped trench, and the electrode contact is formed in the one of the one or more second-conductivity type regions, and the semiconductor device further comprises a gate electrode above the curved portion of the U-shaped trench.

\* \* \* \* \*